(12) United States Patent
Arbetter

(10) Patent No.: US 10,250,244 B2
(45) Date of Patent: *Apr. 2, 2019

(54) MINIMUM PULSE-WIDTH ASSURANCE

(71) Applicant: Silanna Asia Pte Ltd, Singapore (SG)

(72) Inventor: Barry S. Arbetter, Raleigh, NC (US)

(73) Assignee: Silanna Asia Pte Ltd, Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 16/042,103

(22) Filed: Jul. 23, 2018

(65) Prior Publication Data

US 2018/0331677 A1    Nov. 15, 2018

Related U.S. Application Data

(63) Continuation of application No. 15/831,047, filed on Dec. 4, 2017, now Pat. No. 10,033,366, which is a
(Continued)

(51) Int. Cl.
*H02M 3/156* (2006.01)
*H03K 5/156* (2006.01)
(Continued)

(52) U.S. Cl.
CPC .......... *H03K 5/1565* (2013.01); *H02M 3/157* (2013.01); *H03K 3/02337* (2013.01);
(Continued)

(58) Field of Classification Search
CPC . H02M 2001/0003; H02M 2001/0025; H02M 2001/0038; H02M 2001/0048;
(Continued)

(56) References Cited

U.S. PATENT DOCUMENTS 4,013,939 A    3/1977  Bless
5,077,540 A   12/1991  Keith et al.
(Continued)

FOREIGN PATENT DOCUMENTS

JP    2011061887 A    3/2011

OTHER PUBLICATIONS

International Search Report dated Apr. 10, 2018 for PCT Patent Application No. PCT/IB2017/058019.
(Continued)

*Primary Examiner* — Timothy J. Dole
*Assistant Examiner* — Shahzeb K Ahmad
(74) *Attorney, Agent, or Firm* — The Mueller Law Office, P.C.

(57) ABSTRACT

Various methods and devices that involve pulsed signals are disclosed. An example minimum pulse-width (MPW) circuit comprises a first and second logic circuit. A first input of the first logic circuit is connected to an input of the MPW circuit. A first input of the second logic circuit is communicatively coupled to an output of the first logic circuit. The MPW circuit also comprises a MPW filter circuit communicatively coupled to an output of the second logic circuit, a one-shot circuit communicatively coupled to an output of the minimum pulse-width filter circuit and located on a first feedback path, and another one-shot circuit communicatively coupled to the output of the minimum pulse-width filter circuit and located on a second feedback path. A second input of the first logic circuit is on the first feedback path. A second input of the second logic circuit is on the second feedback path.

16 Claims, 9 Drawing Sheets

Related U.S. Application Data continuation of application No. 15/389,361, filed on Dec. 22, 2016, now Pat. No. 9,838,000.

(51) Int. Cl.
*H02M 3/157* (2006.01)
*H03K 3/0233* (2006.01)
*H03K 5/04* (2006.01)
*H03K 5/06* (2006.01)
*H03K 5/1252* (2006.01)
*H02M 1/32* (2007.01)
*H02M 3/158* (2006.01)

(52) U.S. Cl.
CPC ............... *H03K 5/04* (2013.01); *H03K 5/06* (2013.01); *H03K 5/1252* (2013.01); *H03K 5/156* (2013.01); *H02M 1/32* (2013.01); *H02M 3/156* (2013.01); *H02M 3/158* (2013.01)

(58) Field of Classification Search
CPC ........ H02M 1/32; H02M 1/126; H02M 3/156; H02M 3/157; H02M 3/158; H02M 3/1582; H02M 3/1584; H02M 2003/1566; H03K 3/02337; H03K 5/1565
See application file for complete search history.

(56) References Cited

U.S. PATENT DOCUMENTS

| | | |
|---|---|---|
| 5,365,181 A | 11/1994 | Mair |
| 6,529,046 B1 | 3/2003 | Shih |
| 6,906,499 B2 | 6/2005 | Hussein et al. |
| 9,608,613 B2 | 3/2017 | Hargreaves |
| 2002/0093391 A1 | 7/2002 | Ishida et al. |
| 2006/0186927 A1 | 8/2006 | Cusmano et al. |
| 2007/0040608 A1 | 2/2007 | Magrath et al. |
| 2007/0194827 A1 | 8/2007 | Braun |
| 2008/0042633 A1 | 2/2008 | Klein |
| 2008/0048631 A1 | 2/2008 | Kim |
| 2009/0237056 A1 | 9/2009 | Alexander |
| 2010/0033261 A1 | 2/2010 | Stevenson et al. |
| 2010/0090739 A1 | 4/2010 | Huang |
| 2010/0164456 A1 | 7/2010 | Oyama |
| 2011/0215780 A1 | 9/2011 | Lee et al. |
| 2012/0274300 A1 | 11/2012 | Nakashima |
| 2015/0042300 A1 | 2/2015 | Peker et al. |
| 2015/0091628 A1 | 4/2015 | Jang |
| 2018/0269677 A1* | 9/2018 | Yamamura .............. H02M 1/32 |

OTHER PUBLICATIONS

Lee et al., Glitch Elimination by Gate Freezing, Gate Sizing and Buffer Insertion for Low Power Optimization Circuit, 30th Annual Conf. of the IEEE Indus. Elec. Society, Nov. 2-5, 2004, Bussan, Korea.
Notice of Allowance dated Aug. 18, 2017 for U.S. Appl. No. 15/389,361.
Notice of Allowance dated Mar. 28, 2018 for U.S. Appl. No. 15/831,047.
Zanuso et al., A Glitch-Corrector Circuit for Low-Spur ADPLLs, Electronics, Circuits, and Systems, ICECS, Dec. 13-16, 2009.

\* cited by examiner

200

MINIMUM PULSE-WIDTH ASSURANCE

CROSS-REFERENCE TO RELATED APPLICATIONS

This application is a continuation of U.S. Non-Provisional application Ser. No. 15/831,047, filed Dec. 4, 2017, which is a continuation of U.S. Pat. No. 9,838,000, filed Dec. 22, 2016, both of which are incorporated by reference herein in their entirety.

BACKGROUND OF THE INVENTION

Many electronic systems require pulsed signals in which an electronic signal transitions temporarily from a first value to a second value before returning to the first value again. For example, certain power converters utilize pulse-width modulators to control the amount of charge that flows between two different power regimes. As another example, phase-locked loops often utilize a charge pump to keep track of two streams of pulses in order to adjust a degree of phase shift introduced to a signal in order to phase-lock that signal. If the length of a pulse is too short, there is a possibility that downstream circuit blocks will not register the pulse. In other words, if the transition to the second value and back again happens too quickly, the system might not notice that the pulse ever existed.

The problem of missed pulses can be problematic. The accuracy or power efficiency of a system may degrade due to missed pulses. In a more severe case, missed pulses may drive a circuit into an undesirable state that was not anticipated by the designers. For example, missed pulses can cause a latch to fail to read the appropriate input and can store an improper state.

Minimum pulses can be avoided by building a margin of error into a given design so that a worst-case error will still maintain the width of a pulse above a specified threshold. This threshold can be set to the worst-case response time of downstream circuits. However, such an approach can be problematic in that the margin of error can result in a less efficient system. For example, some switched-mode power converters are designed to only allow one pulse to be delivered to the power transistors per switching cycle even during a transient condition in which it would be advantageous to allow more frequent pulses and allow faster settling into another state. An approach that allows for more than one pulse in each period without the danger of entering an unstable state would result in a more efficient device with superior performance.

SUMMARY OF INVENTION

In one embodiment, a minimum pulse-width assurance circuit is disclosed. The minimum pulse-width circuit comprises a first logic circuit. A first input of the first logic circuit is connected to an output of a pulse circuit. The minimum pulse-width circuit also comprises a second logic circuit. A first input of the second logic circuit is communicatively coupled to an output of the first logic circuit. The minimum pulse-width circuit also comprises a minimum pulse-width filter circuit communicatively coupled to an output of the second logic circuit. The minimum pulse-width circuit also comprises a first one-shot circuit communicatively coupled to an output of the minimum pulse-width filter circuit and located on a first feedback path. The minimum pulse-width circuit also comprises a second one-shot circuit communicatively coupled to the output of the minimum pulse-width filter circuit and located on a second feedback path. A second input of the first logic circuit is on the first feedback path. A second input of the second logic circuit is on the second feedback path.

In another embodiment, a power converter is disclosed. The power converter comprises a power transistor with a circuit node, a gate driver providing a control signal to the gate node, a pulse-width modulator comparator generating a pulse-width modulated signal for the gate driver, a minimum pulse-width circuit coupling the pulse-width modulator comparator to the gate driver, and a buffer. The minimum pulse-width circuit includes a first logic circuit, a second logic circuit, a minimum pulse-width filter circuit communicatively coupled to an output of the second logic circuit, a buffer, a first one-shot circuit communicatively coupled to an output of the minimum pulse-width filter circuit and located on a first feedback path, and a second one-shot circuit communicatively coupled to the output of the minimum pulse-width filter circuit and located on a second feedback path. A first input of the first logic circuit is connected to an output of a pulse-width circuit. A first input of the second logic circuit is communicatively coupled to an output of the first logic circuit. A second input of the first logic circuit is on the first feedback path. A second input of the second logic circuit is on the second feedback path. The buffer is connected to the output of the minimum pulse-width filter circuit. A third input of the first logic circuit is communicatively coupled to a pulse-width modulator blank signal source in a power converter. The input of the pulse-width circuit is communicatively coupled to the pulse-width modulator comparator. The output of the buffer is communicatively coupled to the gate driver.

Two devices or circuit nodes are communicatively coupled if the information content of a signal received at the first device or circuit node is fully preserved from one end of the communicative coupling path to the other absent a change in the power supply. For example, buffers, level shifters, or an inverter can be placed on the coupling path between two elements but those two elements are still communicatively coupled because the interconnecting circuitry does not alter the information content of the signal. One device serves to couple two other objects if it provides an electronic connection between them. Coupling means electrically connecting in the manner of a Kirchhoff current path. Connecting refers to a physical connection between two circuit nodes.

DETAILED DESCRIPTION OF THE EMBODIMENTS

Reference now will be made in detail to embodiments of the disclosed invention, one or more examples of which are illustrated in the accompanying drawings. Each example is provided by way of explanation of the present technology, not as a limitation of the present technology. In fact, it will be apparent to those skilled in the art that modifications and variations can be made in the present technology without departing from the scope thereof. For instance, features illustrated or described as part of one embodiment may be used with another embodiment to yield a still further embodiment. Thus, it is intended that the present subject matter covers all such modifications and variations within the scope of the appended claims and their equivalents.

Symmetric hysteresis can be used to preserve the width of pulses passing through a minimum pulse-width assurance circuit. The minimum pulse-width assurance circuit can be configured to assure that both low-to-high and high-to-low pulses are properly treated to extend the pulse-width for either kind of pulse to a desired minimum. The circuit can be configured to extend these pulses to separate assured minimums depending upon the application. The pulse-widths are "assured" by the circuit in that the circuit will not produce pulses with widths that are less than the desired minimum.

A specific application to which the minimum pulse-width assurance circuit can be applied is the control loop of a switching power converter. Certain switching power converters utilize a train of pulses to control one or more power transistors that control the flow of charge between an input power regime and an output power regime. The duty cycle of the pulse train under a set switching frequency can set the degree to which power is transferred from an input power regime to an output power regime. In addition, the power converter may experience divergences from a steady state which require multiple pulses that control the power transistors without regard to the steady-state duty cycle at the switching frequency. In any of these situations, there can exist a need to assure that the pulses passing through the control loop and ultimately delivered to a power transistor maintain a minimum pulse-width.

Figure 1:
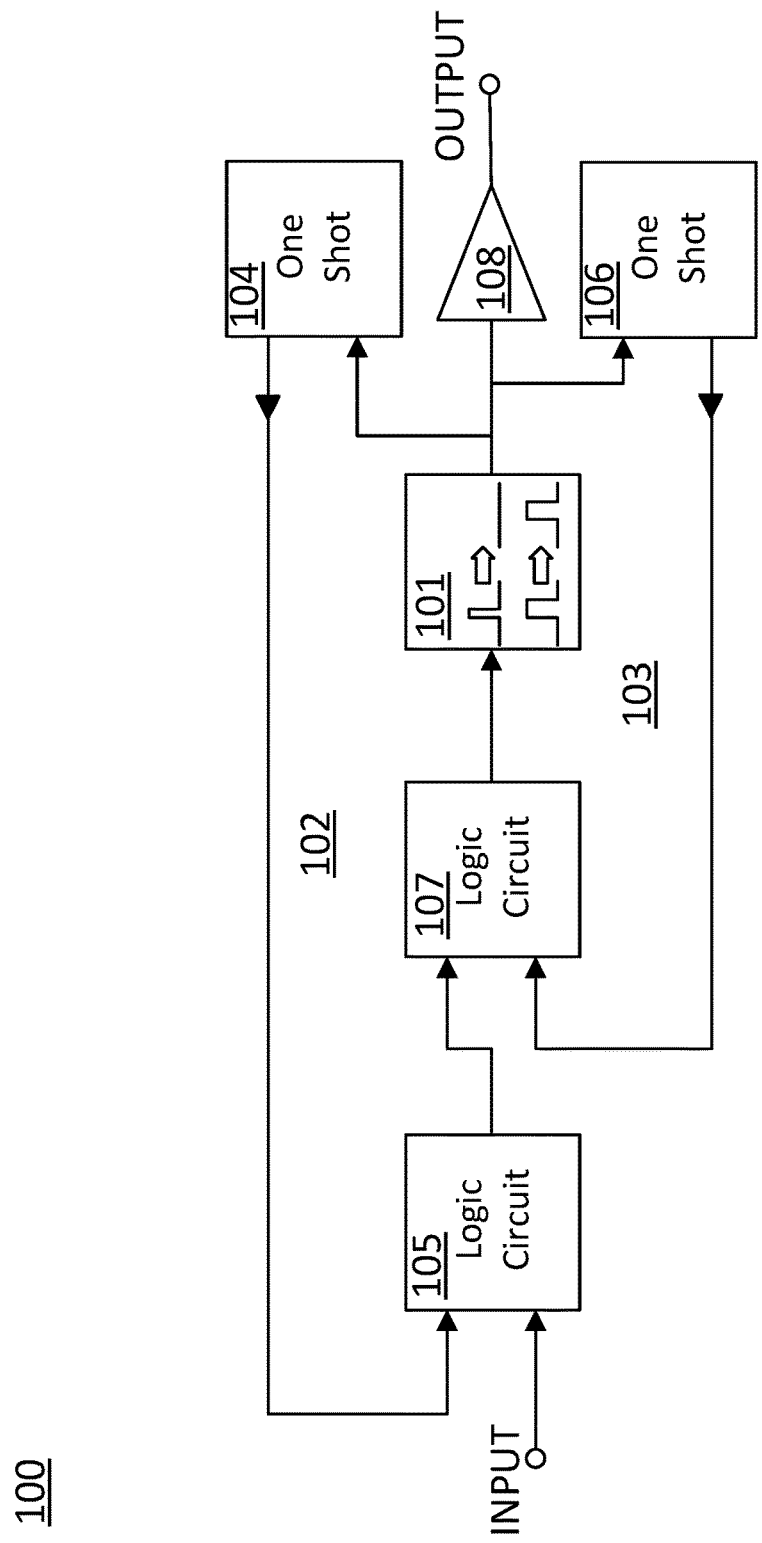
FIG. 1 is a block diagram of a minimum pulse-width assurance circuit.

FIG. 1 illustrates a minimum pulse-width assurance circuit 100. The components of pulse-width assurance circuit 100 work in combination to filter glitches and to assure that pulses of either polarity are assured to have a minimum pulse-width. The circuit assures a minimum pulse-width by extending the width of pulses that would otherwise be narrower than the minimum pulse-width. The circuit filters glitches through the action of minimum pulse-width filter circuit 101. All the blocks in FIG. 1, and any of the specific block diagrams, can be implemented by circuitry formed in a single integrated circuit, and can further be implemented by circuitry formed in a single substrate on an integrated circuit. However, in other approaches the various blocks can be implemented in separate elements such as discrete passive devices and different integrated circuits either co-packaged or in separate packages.

In an ideal case, signals passing from the input to the output of a minimum pulse-width assurance circuit with a minimum pulse-width filter may be processed in three different ways. First, signals provided to the input that have very small widths are treated as glitches and are filtered out. These signals have pulses of a width that is too narrow to provide reliable operation. These signals are not provided on the output in any form. Second, signals provided to the input that have widths that are larger than those in the first category (i.e., the small-width pulses), but are less than the minimum pulse-width, will have their pulse-widths extended by the circuit. These signals are provided on the output with the minimum pulse-width, but they are not otherwise modified by the circuit to an appreciable degree. Third, signals provided to the input that have pulse-widths more than the minimum pulse-width are not affected to an appreciable degree by the pulse-width assurance circuit. The description in this paragraph is meant to explain the ideal performance of a minimum pulse-width assurance circuit with a minimum pulse-width filter and is not meant to limit the scope of the disclosure. Non-idealities can be significant in specific implementations and their effects on processed signals can be appreciable. In particular, if minimum pulse-width filter circuit 101 is non-ideal, input signals may be affected such that their pulse width on the output of the minimum-pulse width assurance circuit is less than their pulse width on the input. However, the circuit can still be designed in accordance with the disclosure herein to assure that the pulse width that the pulses are reduced to still exceeds a desired minimum pulse-width.

Minimum pulse-width assurance circuits can assure that pulses of either polarity exhibit the minimum pulse-width on the output of the circuit. As illustrated in FIG. 1, minimum pulse-width assurance circuit 100 includes two feedback paths—first feedback path 102 and second feedback path 103. The two feedback paths are each individually associated with extending pulses of a given polarity. Pulses of the opposing polarity are effectively ignored by the other feedback path. Minimum pulse-width assurance circuit 100 is provided at a sufficiently high level of generality that either first feedback path 102 or second feedback path 103 could be responsible for extending pulses of either polarity so long as each was assigned to pulses of opposite polarities. The pulse polarity that first feedback path 102 handles is set by the characteristics of one-shot circuit 104 and logic circuit 105. The pulse polarity that second feedback path 103 handles is set by the characteristics of one-shot circuit 106 and logic circuit 107.

FIG. 1 provides an example topology for a minimum pulse-width assurance circuit. The topology of minimum pulse-width assurance circuit 100 includes logic circuit 105 with a first input connected to an input of the minimum pulse-width assurance circuit 100. A first input of logic circuit 107 is communicatively coupled to an output of logic circuit 105. The logic circuits conduct a logic operation on their inputs to produce an output based thereon. For example, the logic circuits could conduct a logical AND operation, OR operation, XOR operation, or any other form of logic to produce an output signal on their outputs. As will be described later, the kind of logical operation conducted could be selected in combination with the characteristics of the corresponding one-shot circuit to address pulses of a given polarity.

The topology of minimum pulse-width assurance circuit 100 also includes minimum pulse-width filter circuit 101 communicatively coupled to an output of the second logic circuit. The output of the minimum pulse-width filter circuit 101 is communicatively coupled to one-shot circuit 104 and one-shot circuit 106. These separate branches of the block diagram, extending from minimum pulse-width filter circuit 101 to each of the two one-shot circuits, are portions of the two separate feedback paths 102 and 103. One-shot circuit 104 is on feedback path 102, while one-shot circuit 106 is on feedback path 103. The node at which the feedback paths diverge also contains the minimum pulse-width assurance circuit output signal. This signal can be buffered before serving as the output of the overall circuit. In the example of FIG. 1, buffer 108 buffers the output signal and delivers it to downstream circuit blocks.

In topologies in accordance with some of the minimum pulse-width assurance circuit disclosed herein, each of the feedback paths loops back to an input of one of the logic circuits. Depending upon the type of logic operation conducted by the logic circuits, looping back to an input of the logic circuit allows the one-shot circuits to control the output of the logic circuit such that the logic circuit ignores other inputs. In the example of FIG. 1, a second input of logic circuit 105 is on feedback path 102, and a second input of logic circuit 107 is on feedback path 103. As illustrated, the second inputs of both logic circuits 105 and 107 are communicatively coupled to an output of their corresponding one-shot circuits 104 and 106, respectively.

The one-shot circuits can respond to pulse edges of different polarities. As a result, certain disclosed minimum pulse-width assurance circuits are able to extend both pulses that transition from low to high and back to low and pulses that transition from high to low and back to high. Throughout this disclosure pulses that transition from low to high and back to low are referred to as rising, high, low-to-high, or positive pulses, and pulses that transition from high to low and back to high are referred to as falling, low, high-to-low, or negative pulses. The one-shot circuits can alter their output states temporarily in response to detecting a specific edge type and impact the feedback path in such a way that a minimum pulse-width of a given pulse type is assured.

The one-shot circuits could be monostable multivibrator circuit blocks. The monostable multivibrator circuit blocks could transition from the stable state to the unstable (i.e. transient) state in response to detecting a particular pulse edge on their inputs. For example, one-shot circuit 104 could transition into an unstable state in response to a rising pulse indicated by the receipt of a rising edge, while one-shot circuit 106 could transition from the stable state to the unstable state in response to a falling pulse indicated by a falling edge. The one-shot circuits could then transition back to their stable states after a period of time set by their internal characteristics. The result would therefore be signals on the feedback paths that alter their states temporarily in response to a detected edge. In the example of FIG. 1, the signals that temporarily change their states are delivered to logic circuit inputs where they are able to temporarily control the output of the logic circuit.

In a specific implementation, one-shot 104 can be configured to respond to rising edges and one-shot 106 can be configured to respond to falling edges. In this approach, one-shot circuit 104 enters an unstable state in response to a low-to-high transition on the output of minimum pulse-width filter circuit 101. The second one-shot circuit 106 enters an unstable state in response to a high-to-low transition on the output of minimum pulse-width filter circuit 101. As a result, one-shot circuit 104 extends a high pulse to a first minimum width, while one-shot circuit 106 extends a low pulse to a second minimum width.

In another specific implementation, one-shot circuit 104 can be configured to respond to falling edges and one-shot 106 can be configured to respond to rising edges. In this approach, one-shot circuit 104 enters an unstable state in response to a high-to-low transition on the output of the minimum pulse-width filter circuit block. The second one-shot circuit 106 enters an unstable state in response to a low-to-high transition on the output of minimum pulse-width filter circuit 101. As a result, one-shot circuit 104 extends a low pulse to a first minimum width, while one-shot circuit 106 extends a high pulse to a second minimum width.

In specific approaches, a minimum pulse-width filter is used before the one-shot circuits in order to filter glitches that are too narrow for the downstream circuitry to handle. For example, a monostable multivibrator needs a trigger pulse of a minimum duration to function properly. The minimum pulse-width filter removes pulses that are too narrow to be acted on by downstream circuitry. In the example of FIG. 1, pulses that are too narrow for one-shot circuits 104 and 106 to respond to via their associated feedback paths could set the system into unwanted oscillations or a metastable state if minimum pulse-width filter 101 is not employed. A more specific example of a minimum pulse-width filter circuit can be described with reference to FIGS. 2 and 3.

Figure 2:
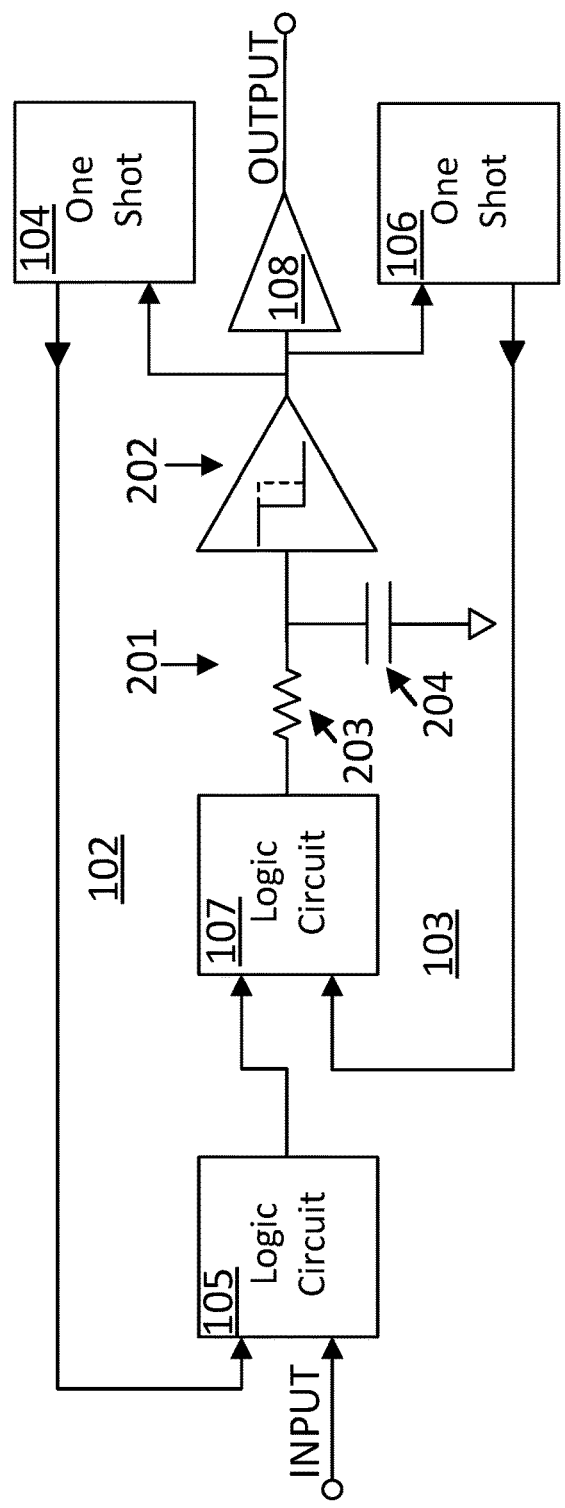
FIG. 2 is a block diagram of a minimum pulse-width assurance circuit using a low-pass filter and Schmitt trigger as a minimum pulse-width filter circuit.

FIG. 2 includes minimum pulse-width assurance circuit 200 in which like components are labeled with the same reference numbers as in FIG. 1. In FIG. 2, minimum pulse-width filter circuit 101 has been replaced by R-C (resistor-capacitor) filter 201 and Schmitt trigger circuit 202. The minimum pulse-width filter circuit could comprise any low-pass filter communicatively coupled to an output of logic circuit 107. The minimum pulse-width filter circuit could also comprise any kind of amplifier with hysteresis communicatively coupled to the low pass filter circuit. In the particular example of FIG. 2, the low-pass filter circuit is an R-C filter. The resistor and capacitor could be passive devices formed on the same integrated circuit as the other components in the block diagram or could be separate discrete components. As illustrated, R-C filter 201 includes filter resistor 203 that couples an output of second logic circuit 107 to an input of Schmitt trigger circuit 202. The reactive component of R-C filter 201 is filter capacitor 204 that couples the input of Schmitt trigger circuit 202 to a DC-bias voltage (illustrated as ground). Note that throughout this specification and in the attached figures, the use of the term "ground" or the ground symbol should be interpreted broadly to encompass a DC-bias voltage. In other words the term "ground" is used herein to refer to a particular DC-bias voltage of zero. In the particular example of FIG. 2, Schmitt trigger circuit 202 is coupled to an output of R-C filter 201. The output of the Schmitt trigger circuit is the output of the minimum pulse-width filter circuit of FIG. 2, which may be buffered through buffer 108.

In operation, the low-pass filter will screen out pulses that change too rapidly from one state to another and back again. For example, really short low and high pulses will be screened out by the low-pass filter. At the same time, an amplifier with hysteresis, such as Schmitt trigger 202, connected to the output of the low-pass filter can then recover pulses that survived the low-pass filter to something close to their original pulse-width if the trigger trip points of the Schmitt trigger are symmetric about the midpoint logic voltage. Therefore, the combined minimum pulse-width filter circuit can be designed to screen out short pulses but not have an appreciable effect on pulses that are larger than a desired minimum.

Figure 3A:
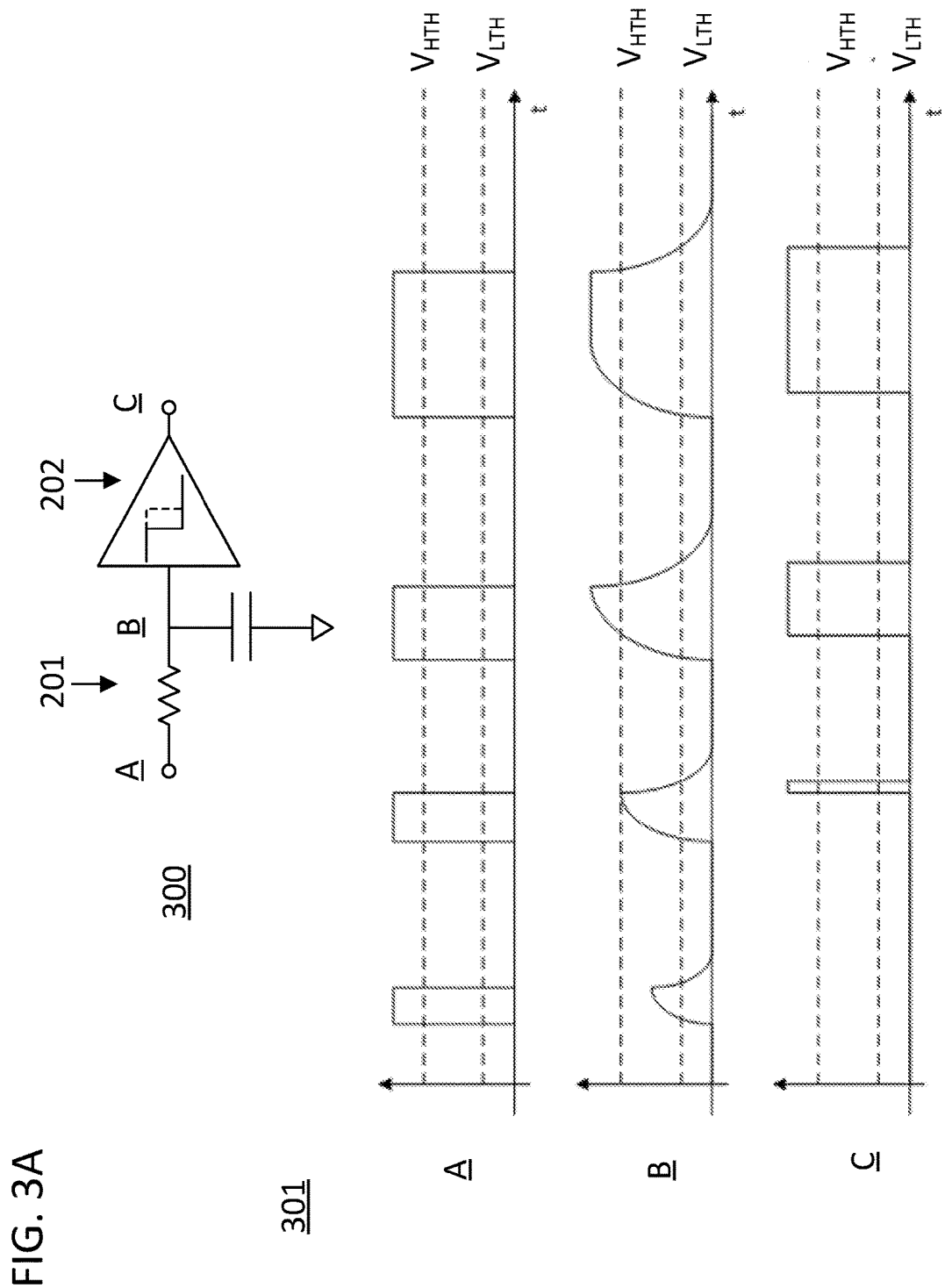
FIG. 3A is a block diagram of the minimum pulse-width filter circuit used in FIG. 2 and a set of waveforms to describe how the minimum pulse-width filter circuit filters low-to-high glitches.
Figure 3B:
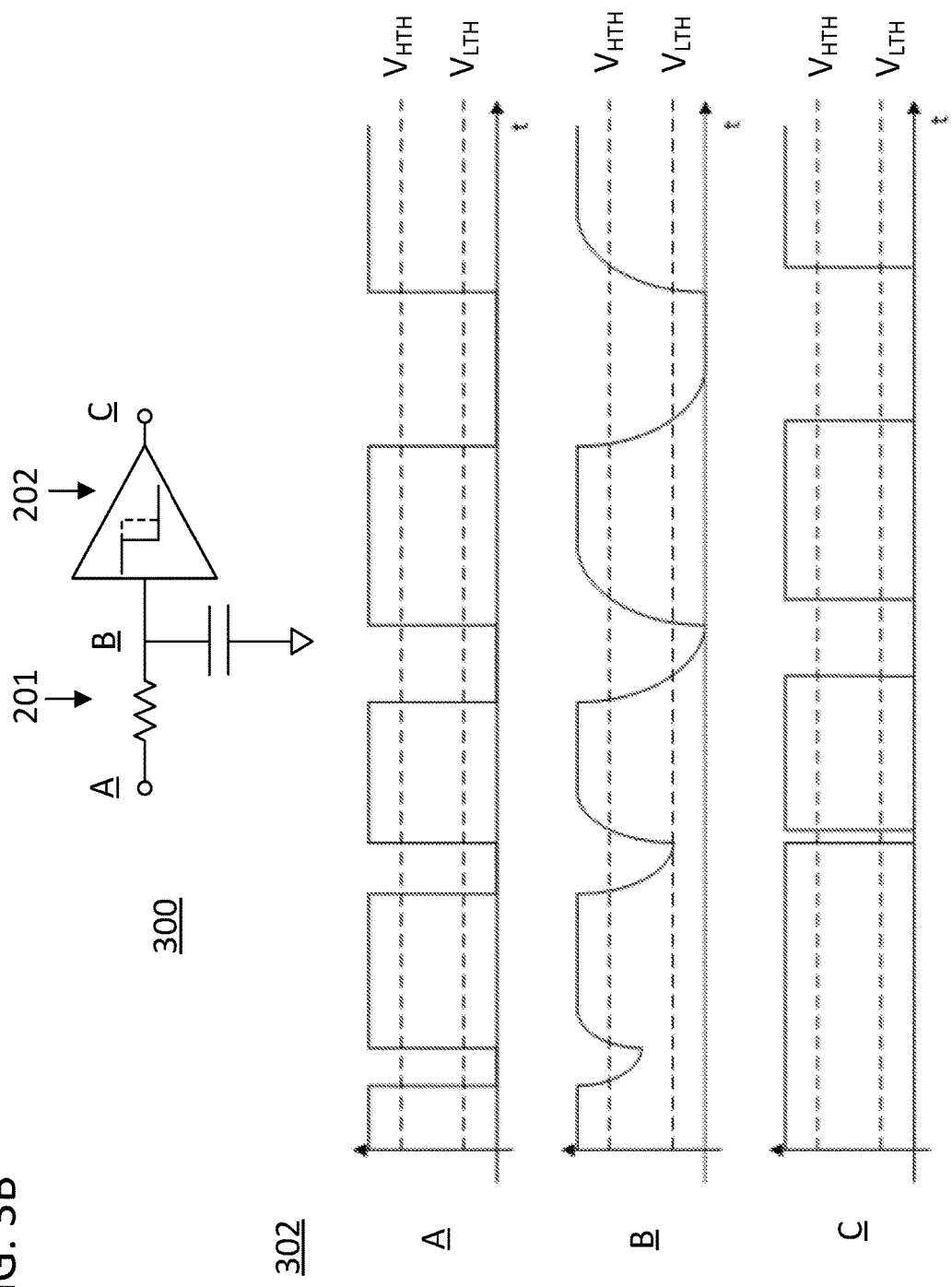
FIG. 3B is a block diagram of the minimum pulse-width filter circuit used in FIG. 2 and a set of waveforms to describe how the minimum pulse-width filter circuit filters high-to-low glitches.

FIGS. 3A and 3B illustrate two sets of waveforms 301 and 302 along with a block diagram 300 of a sample minimum pulse-width filter circuit in accordance with the approach of FIG. 2. Three nodes of block diagram 300 are marked "A," "B," and "C." Similar marks can be found below waveform sets 301 and 302 to illustrate the signals appearing on each of those nodes in response to two different scenarios that are illustrated by those waveform sets. Waveform set 301 shows the response of the filter circuit to a set of low-to-high pulses of varying widths. Waveform set 302 shows the response of the filter to a set of high-to-low pulses of varying widths. As seen in a comparison of the waveforms at nodes A and B, the filter resistor and filter capacitor of low-pass filter 201 smooth the pulse edges of pulses provided to the input. Furthermore, as can be seen in a comparison of nodes B and C, the Schmitt trigger circuit sharpens the pulse edge of pulses that are at least as wide as the minimum allowable pulse.

In waveform set 301, a pulse on node A does not have a sufficient width and is desirously screened out by the minimum pulse-width filter circuit. Hashed lines marked $V_{LTH}$ indicate the low trip point of Schmitt trigger circuit 202 while hashed lines marked $V_{HTH}$ indicate the high trip point of Schmitt trigger circuit 202. As seen on the plot of node B in waveform set 301, R-C filter 201 prevents the signal on node B from charging up past the high trip point in the time set by the width of the smallest pulse. As a result, the Schmitt trigger circuit does respond to the pulse edge in waveform set 301, and does not trip. Therefore, the output on node C of waveform set 301 remains unchanged. Waveform set 302 illustrates how the same circuit works to screen pulses having the opposite polarity (i.e., high-to-low pulses). As seen, the smallest pulse at node A in waveform set 302 is not wide enough to allow node B to discharge and the output on node C of waveform set 302 remains unchanged. However, wider pulses do result in pulses on output node C.

The examples in FIG. 3 were selected to illustrate the operation of a minimum pulse-width filter circuit with input pulses that are just barely on either side of the filtering action. As seen, the trip points of the Schmitt trigger circuit, the size of the filter resistor, and the size of the filter capacitor all define a minimum width pulse that will pass through the pulse-width filter. In some applications, the minimum pulse-width filter circuit will be used to screen glitches out of the circuit by not allowing pulses through that are so short they could put downstream circuitry into a metastable state. Therefore, the minimum width of a pulse that can pass through the pulse-width filter relatively unchanged can be referred to as the deglitch period of the minimum pulse-width filter. For example, it may take a deglitch period for one-shot circuit 104 implemented as a monostable multivibrator to enter the unstable state in response to a rising edge pulse. Therefore, the deglitch period will assure that the input signal to the one-shot circuit doesn't change before the state of the one-shot circuit has been set.

The one-shot circuits of the minimum pulse-width assurance circuit can take on numerous forms. The one-shot circuits could be monostable multivibrator circuits that are designed to transition temporarily from their stable state to their unstable state and return to their stable state after a set period of time has expired. The one-shot circuits respond to pulse edges. The two one-shot circuits utilized in any given minimum pulse-width assurance circuit could respond to pulses having opposite polarities. The one-shot circuits could require a deglitch period of time to pass after a pulse edge in order to assure proper functionality for the circuit overall. For example, the time it takes a monostable multivibrator circuit to transition from the stable state to the unstable state could be referred to as the transition period, and the overall circuit would be designed to assure that pulses shorter than the transition period were not delivered to the one-shot circuit. One such design approach would be to design the minimum pulse-width filter so that no pulses shorter than the deglitch period would reach the inputs of the one-shot circuits.

The one-shot circuits could be designed so that there was no need for a clock, set, reset, or other control input. If the circuit does not require digital latches or digital signals it could exhibit less of a routing challenge than other approaches and would place fewer constraints on the control system of the chip it was a part of. Indeed, if a minimum pulse-width filter such as the one explained with FIG. 2 is utilized, and the one-shot circuitry is chosen appropriately, there would not be a need for digital latches in the minimum pulse-width assurance circuit as a whole.

Figure 4:
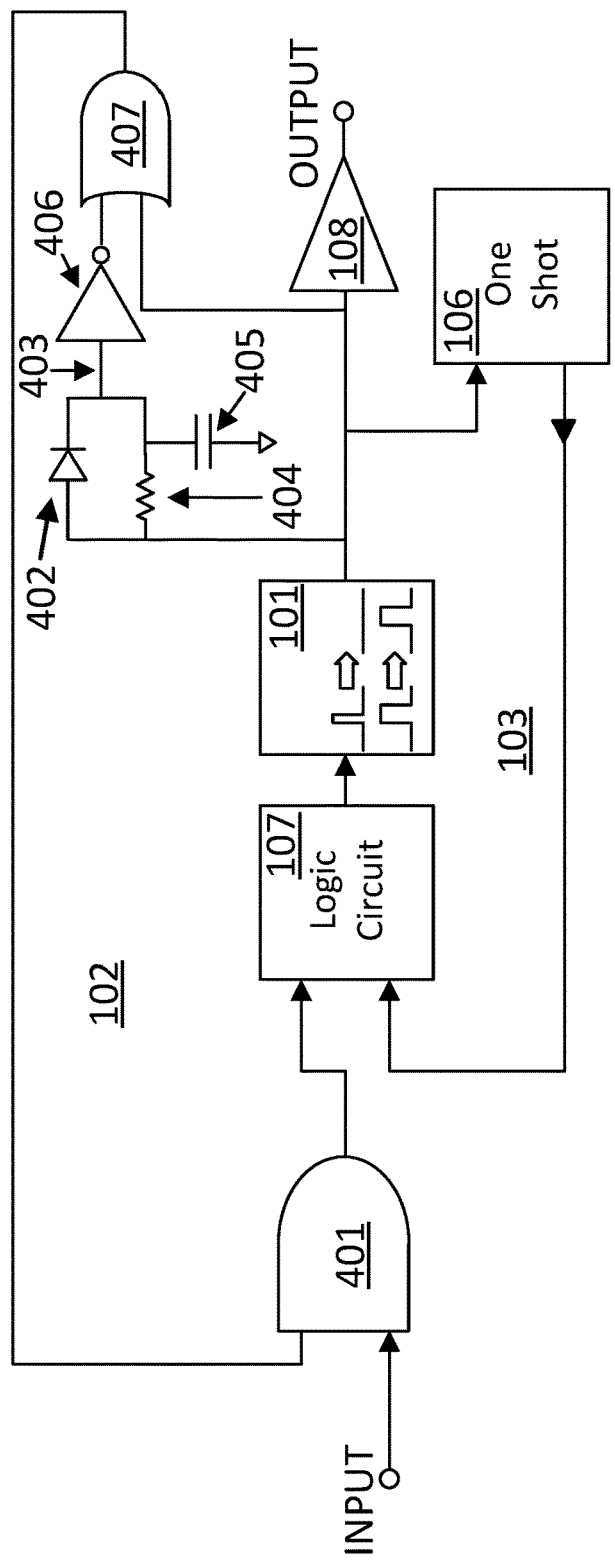
FIG. 4 is a block diagram of a minimum pulse-width assurance circuit using a resistor, capacitor, and diode circuit as a one-shot timer circuit for a first feedback path.

FIG. 4 illustrates a potential implementation of a one-shot circuit that can be used with the minimum pulse-width assurance circuits disclosed herein. As illustrated, one-shot circuit 104 has been replaced with a more specific implementation. One-shot circuit 106 could also be replaced with a similar circuit responding to a different pulse edge polarity, or it could be replaced with an entirely different one-shot circuit. Furthermore, feedback path 102 assures a minimum width for a low pulse. However, altering the characteristics of logic circuit 105 and one-shot circuit 104 would allow feedback path 102 to assure the width of the minimum high pulse, while feedback path 103 assured the width of the minimum low pulse.

FIG. 4 illustrates one possible configuration for a one-shot circuit that can be used with the minimum pulse-width assurance circuits disclosed herein. As illustrated, one-shot circuit 104 has been replaced with a resistor, capacitor, and diode circuit in minimum pulse-width assurance circuit 400. The illustrated one-shot circuit works in combination with an AND gate 401 to assure a minimum pulse-width for a low pulse. The one-shot circuit of FIG. 4 includes diode 402 connected to an output of minimum pulse-width filter circuit 101 and a one-shot circuit node 403. The one-shot circuit also includes resistor 404 (connected to an output of minimum pulse-width filter circuit 101 and one-shot circuit node 403) and capacitor 405 (that couples one-shot circuit node 403 to a ground node). The one-shot circuit also includes a logic circuit 406 communicatively coupled to one-shot circuit node 403. As illustrated, the logic circuit 406 is an inverter, which may be a Schmitt trigger inverter, and which provides an output to the input of logic circuit 407. Implementing inverter 406 with hysteresis can provide certain benefits in that the input on node 403 can be slowly changing given the time it takes to charge capacitor 405. Logic circuit 407 is an OR gate with inputs coupled to the output of logic circuit 406 and the output of minimum pulse-width filter circuit 101. The output of logic circuit 406 and logic circuit 407 are on the first feedback path 102. In the example of FIG. 4, one-shot circuit node 403 can also be referred to as a charging node because the capacitor that it is coupled to charges up in response to a specific pulse edge that the one-shot circuit is configured to respond to. As will be described later, the charging time of the charge node is related to the minimum pulse-width that is assured by the overall circuit.

Figure 5:
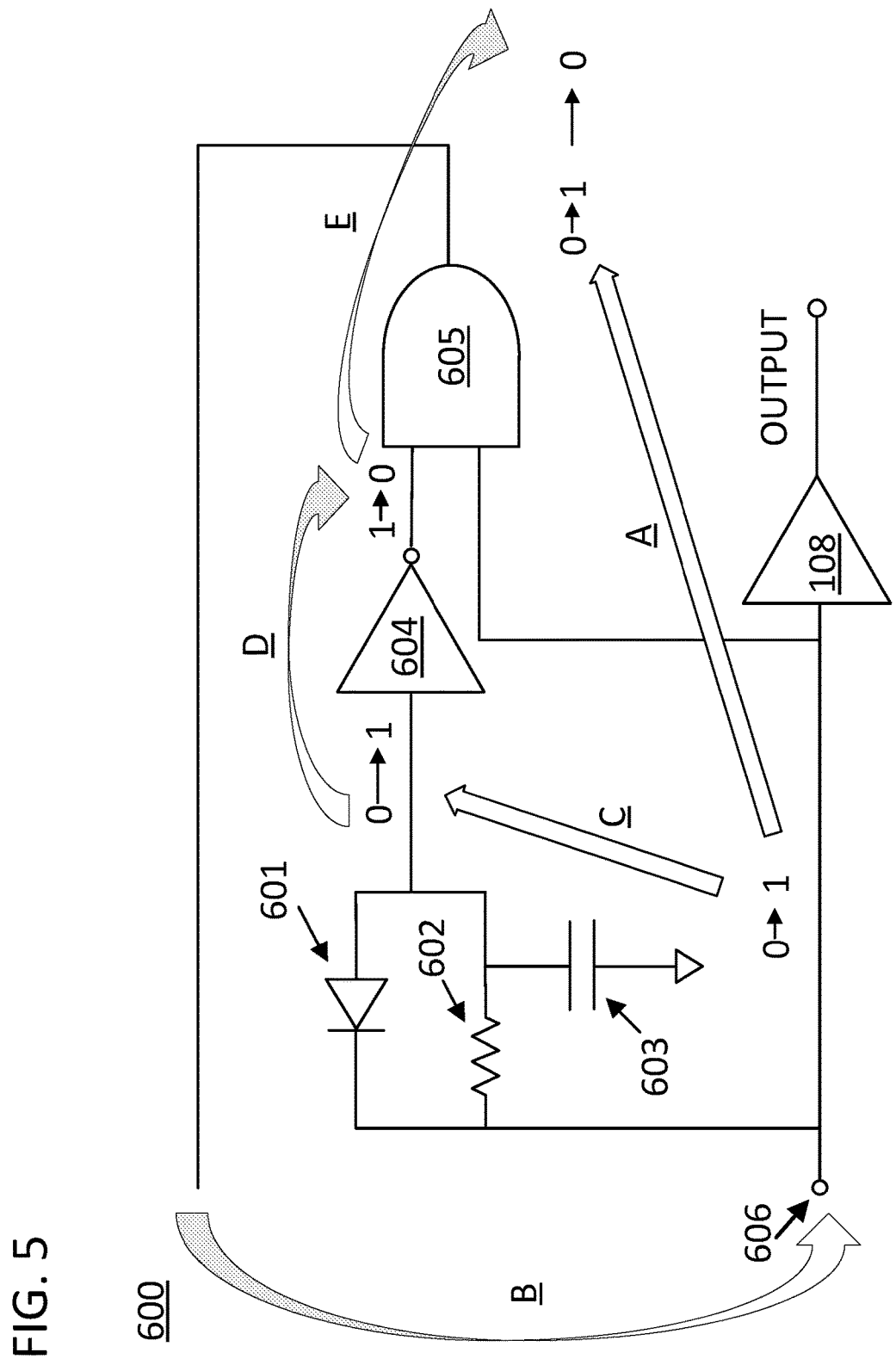
FIG. 5 is a block diagram of the lower one-shot circuit of FIG. 4 labeled with logical transitions to describe how the circuit assures a minimum pulse-width for a pulse of a given polarity.

FIG. 5 provides a block diagram of one-shot circuit 600 and is overlain with signal transitions to describe the operation of the circuit within the context of the entire minimum pulse-width assurance circuit. One-shot circuit 600 is a resistor, capacitor, and diode circuit and is used to assure a minimum width for a high pulse. With reference back to FIG. 1, one-shot circuit 600 could be used in place of one-shot circuit 106 where logic circuit 107 is a logical OR gate. One-shot circuit 600 includes diode 601, resistor 602, and capacitor 603. The one-shot circuit 600 also includes an inverter 604, which may be a Schmitt trigger inverter, and an AND gate 605.

As one-shot circuit 600 is used to assure a minimum width for a high pulse, it is configured to respond to a rising edge of a pulse. This rising edge is represented by a transition from 0 to 1 indicated on node 606. In response to this rising edge, transition A occurs in which the output of AND gate 605 transitions from 0 to 1. The other input to AND gate 605 is already at logic 1 because that is the value the circuit resets to when node 606 is at logic 0. As noted, logic gate 107 is a logical OR gate and has an input communicatively coupled to the output of AND gate 605. As such, when the output of AND gate 605 transitions from 0 to 1 one-shot circuit 600 effectively locks node 606 at 1 via transition B regardless of what happens at the input of the minimum pulse-width assurance circuit. In other words, the input signal can transition low and the output of the circuit will remain high. This action is precisely what is needed to extend the width of a pulse to a desired minimum. The time it takes for the transition on node 606 to effect transition A and B can in some implementations set the minimum deglitch period required for the minimum pulse-width filter 101.

The period during which one-shot circuit 600 maintains the pulse in a high state is set in part by the time it takes to charge up capacitor 603. This transition is illustrated by transition C in which, after a given period of time, capacitor 603 is charged and the input to inverter 604 transitions high. Transition D illustrates the tripping of inverter 604 such that one of the inputs to AND gate 605 transitions low. This is followed by transition E in which the output of AND gate 605 transitions back to low. Again, since the output of AND gate 605 is fed back to logic circuit 107 in FIG. 1, transition E effectively releases control of the main signal path of the circuit from one-shot circuit 600. The other signal provided to the OR gate used in place of logic circuit 107 in FIG. 1 will control the output of that logic gate without reference to the low value provided by AND gate 605. As a result, when the input to the pulse-width assurance circuit transitions low, if it hasn't already, node 606 will transition to a low value. One-shot circuit 600 will be reset by this transition as all of the charge on capacitor 603 can flow quickly through diode 601 and bring the charging node of one-shot circuit 600 back to low, which will propagate through the inverter 604 to provide a high value to the second input of the AND gate 605, so that it is ready for the next cycle.

As mentioned, multiple potential configurations for one-shot circuits 104 and 106 and logic circuit 105 and 107 are possible. The use of one-shot circuit 600 in combination with an OR gate as logic circuit 107 was used as one example, but multiple other configurations are possible. Logic circuit 105 can be an AND gate while logic circuit 107 is an OR gate or vice versa. In either situation, an OR gate can be used in place of logic circuit 105 or 107 to assure a minimum width for a high pulse, as a high value provided to an OR gate dominates other inputs and leaves the output high. In either situation, an AND gate can be used in place of logic circuit 105 or 107 to assure a minimum width for a low pulse, as a low value provided to an AND gate dominates the other inputs and leaves the output low. The use of other logic gates is also possible to assure minimum pulse widths. The logic gate of the resistor, capacitor, and diode one-shot circuits described with reference to FIGS. 4 and 5 can be OR gates for purposes of assuring the width of a high pulse and an AND gate for assuring the width of a low pulse.

Figure 6:
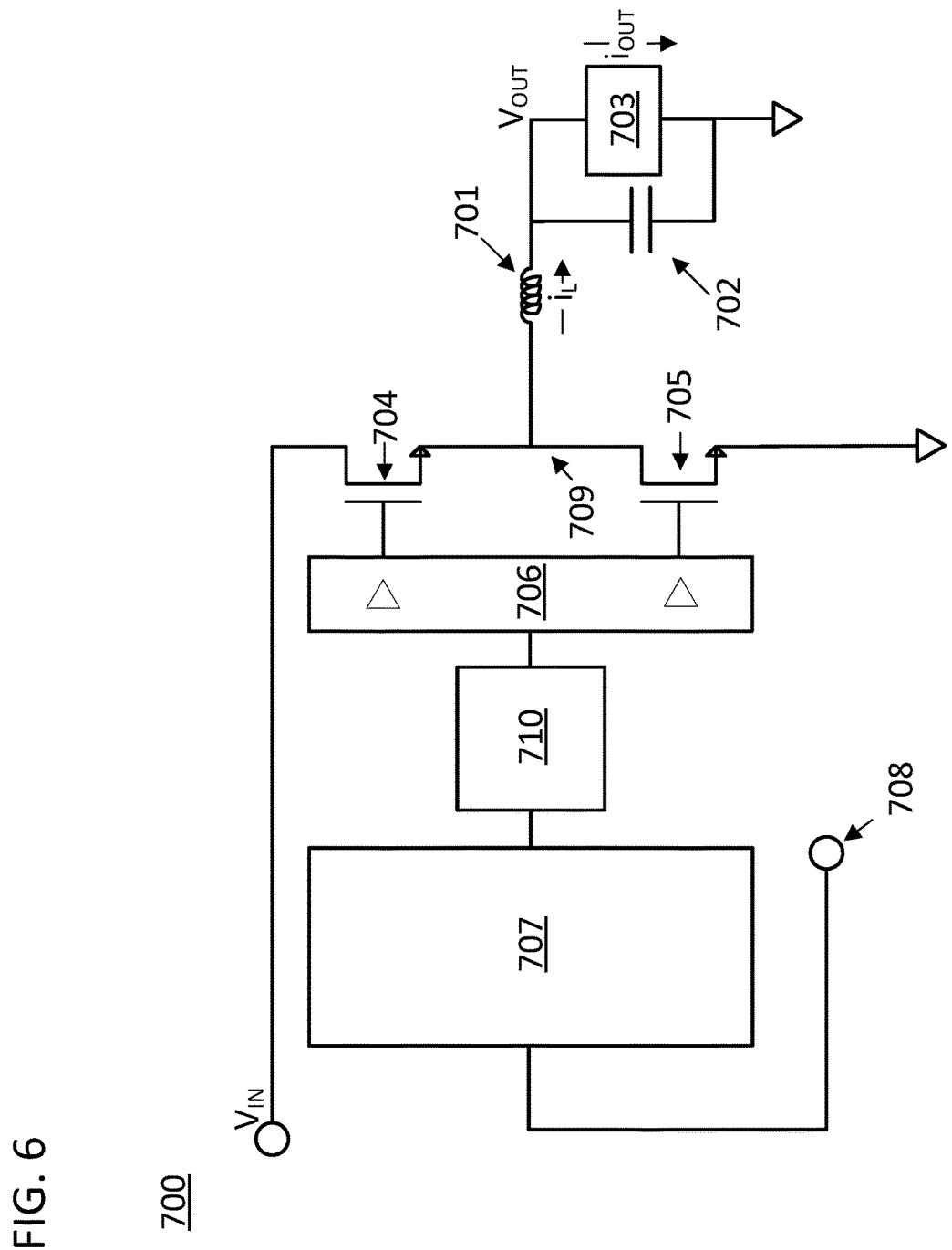
FIG. 6 is a block diagram of a power converter using a minimum pulse-width assurance circuit located between a pulse-width modulator comparator and a gate driver circuit.

FIG. 6 illustrates a block diagram of a power converter 700. The power converter shown is an example of a switching converter. Such converters utilize the rapid switching of switches to transfer power in a controlled manner from a power source connected to their input to a load connected to their output. These power converters are often referred to as switching regulators or switched mode regulators. Power converter 700 is one example of a switching regulator in the form of a buck converter. Buck topology is utilized when the input of the power converter is at a higher voltage than the output. As illustrated, voltage $V_{IN}$ is higher than the voltage $V_{OUT}$. A load current $i_{OUT}$ is provided through an output filter comprising inductor 701 and capacitor 702 to load 703. Switches 704 and 705 are controlled by a driver circuit 706 and a feedback circuit 707 which receives information regarding the state of the load and/or power converter on node 708. Switches 704 and 705 can be power transistors with gate nodes. Driver circuit 706 can include gate drivers that provide control signals to those gate nodes.

Feedback circuit 707 is often designed to include a pulse-width modulator, or PWM, which is a circuit that generates a PWM signal with pulses having varying widths. The pulses can be generated once for every period of the switching frequency during steady-state operation. The pulse width sets the duty cycle of the power converter and is roughly proportional to the time that one of switches 704 and 705 are on during a given switching cycle. During regular operation, switches 704 and 705 alternately provide current from input $V_{IN}$ to the phase node 709 (also called the switch node) and couple phase node 709 to ground. As such, the pulse width sets the amount of power delivered from the input to the output. At very high or very low duty cycles, the pulses can appear to be very short high pulses or very short low pulses. In particular, during a transient state, when the state of the load is changing dramatically, the output of feedback circuit may be transmitting pulses with small widths.

Pulses that are too short can causes glitches in the power converter and other deleterious effects. In addition, other techniques used to assure that a pulse has an adequate width involve the use of latches which may extend a pulse longer than is necessary. In the case of a switching regulator, latch based circuits may prevent the control circuit from generating more than one pulse per clock cycle. To prevent glitches while still maintaining the ability to have multiple pulses per clock cycle, minimum pulse-width assurance circuit 710 can be added to couple the PWM of feedback circuit 707 to driver circuit 706. With reference to FIG. 1, this would involve the output of buffer 108 being communicatively coupled to gate driver 706, and the input of the minimum pulse-width assurance circuit being communicatively coupled to the PWM comparator of feedback circuit 707.

Figure 7:
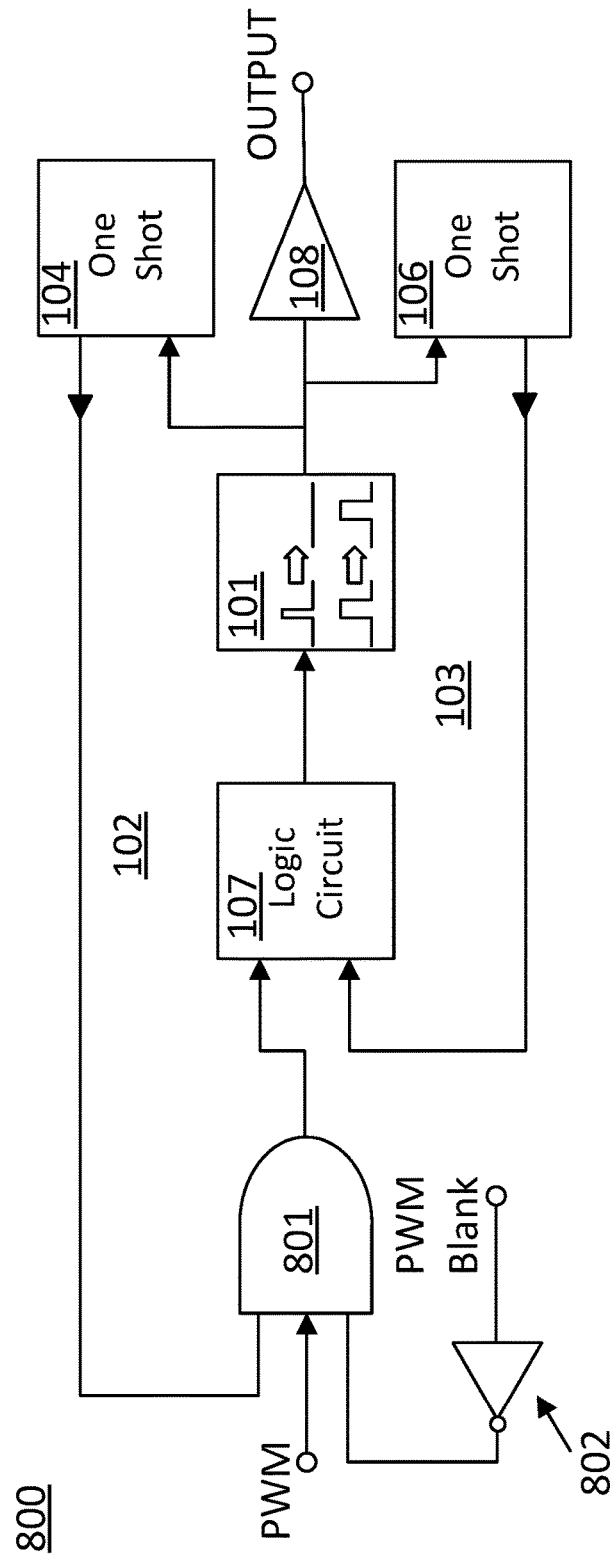
FIG. 7 is a block diagram of a minimum pulse-width assurance circuit used in FIG. 6.

FIG. 7 illustrates a block diagram of a minimum pulse-width assurance circuit 800 that is similar to the circuit of FIG. 1, but it has been specifically modified to operate in a switching regulator with a PWM modulator. As illustrated, the first logic gate in circuit 800 is an AND gate 801 that receives an input in the form of a PWM signal and another input in the form of a PWM blank signal that has been inverted by an inverter 802. The circuit will provide an OUTPUT signal that is in accordance with the output signals provided by previous circuits. However, the output can also be set to zero when the PWM blank signal is high. Note that a similar approach can be applied to minimum pulse-width assurance circuits with an OR gate as the first logic gate in the circuit with inverter 802 removed. The PWM blank signal can be used to blank the output of the PWM comparator. The PWM blank signal can beneficially be used during a startup or reset process to assure that the PWM comparator is not producing an erroneous output.

Figure 8:
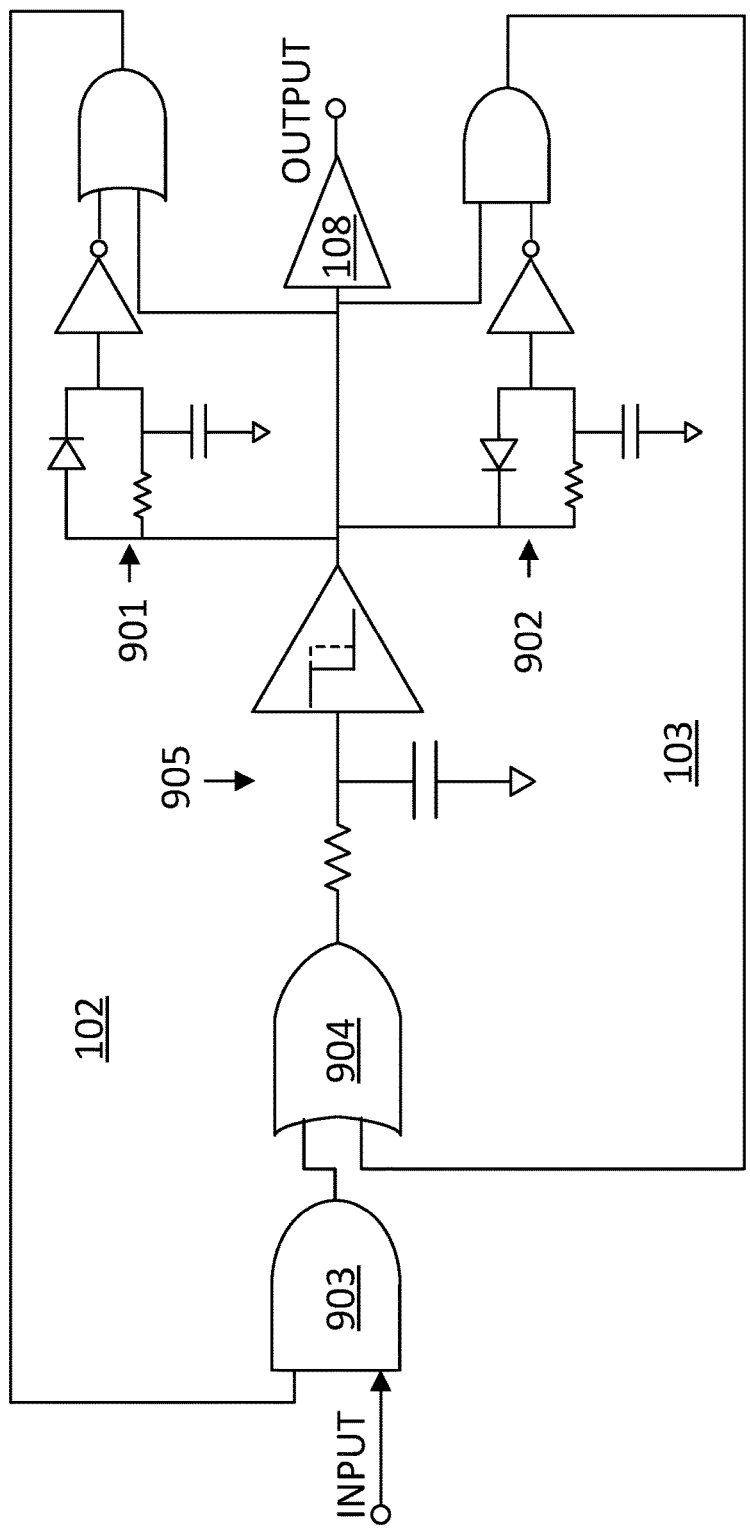
FIG. 8 is a block diagram of a minimum pulse-width assurance circuit that uses one-shot timer resistor, capacitor, and diode circuits for both a first and second feedback path.

FIG. 8 illustrates a block diagram of a particular topology for a minimum pulse-width assurance circuit 900 that utilizes a combination of approaches disclosed above. In this approach, the one-shot circuits are both implemented by resistor, capacitor, and diode circuits 901 and 902. One-shot resistor, capacitor, and diode circuit 901 is associated with feedback path 102 and provides an output signal to AND gate 903. One-shot resistor, capacitor, and diode circuit 902 is associated with feedback path 103 and provides an output signal to OR gate 904. As illustrated, the minimum pulse-width filter 905 takes the form of the minimum pulse-width filter disclosed in FIG. 2. In minimum pulse-width assurance circuit 900, feedback path 102 is utilized to assure that low pulses exhibit a minimum width, while feedback path 103 is utilized to assure that high pulses exhibit a minimum width. The width of pulses that are rejected by minimum pulse-width filter 905 is selected so that signals can propagate through the one-shot circuits and back through logic gates 903 and 904. For example, the pulse width filtered by minimum pulse-width filter 905 could be on the order of hundreds of picoseconds.

While the specification has been described in detail with respect to specific embodiments of the invention, it will be appreciated that those skilled in the art, upon attaining an understanding of the foregoing, may readily conceive of alterations to, variations of, and equivalents to these embodiments. Although examples in the disclosure were directed to switching power converters that provided a fixed voltage to a regulated regime, the same approaches can be applied to power converters that provide a fixed current to a regulated regime. In the provided examples, the polarity of reference, ground, and signal carrying voltages can be switched in whole or in part to achieve similar results. For example, a logic low and logic high could be switched provided an additional inverter was added to the system or provided the entire system switched. Furthermore, although examples in the disclosure were directed at switching converters the approaches disclosed herein apply to any power converter scheme that transitions between operating modes and includes a control loop using pulsed signals. Furthermore, although the specific example of use in a power converter was provided, the minimum pulse-width assurance circuits disclosed herein are equally applicable to any application with pulses in which the pulses must be kept wider than a desired value. These and other modifications and variations to the present invention may be practiced by those skilled in the art, without departing from the scope of the present invention, which is more particularly set forth in the appended claims.

What is claimed is:

1. A method for assuring a minimum pulse-width using a minimum pulse-width assurance circuit, the method comprising:

receiving a first signal at a first input of a first logic circuit, wherein the first input of the first logic circuit is coupled to an input of the minimum pulse-width assurance circuit;

receiving, at a second input of the first logic circuit, a second signal from a first one-shot circuit;

receiving, at a first input of a second logic circuit, a third signal from the first logic circuit, wherein the third signal is based on the first signal and the second signal;

receiving, at a second input of the second logic circuit, a fourth signal from a second one-shot circuit;

receiving, at an input of a minimum pulse-width filter circuit, a fifth signal from the second logic circuit, wherein the fifth signal is based on the third signal and the fourth signal, and wherein an output of the minimum pulse-width filter circuit is communicatively coupled to an output of the minimum pulse-width assurance circuit;

receiving, at an input of the first one-shot circuit and at an input of the second one-shot circuit, a sixth signal from the minimum pulse-width filter circuit, wherein the sixth signal is generated based on a pulse width of the fifth signal;

receiving, at the second input of the first logic circuit, a seventh signal from the first one-shot circuit, wherein the seventh signal is based on a signal transition of the sixth signal; and receiving, at the second input of the second logic circuit, an eighth signal from the second one-shot circuit, wherein the eighth signal is based on the signal transition of the sixth signal.

2. The method of claim 1, wherein:
the third signal is based on a logic operation performed by the first logic circuit on the first signal and the second signal.

3. The method of claim 1, wherein:
the fifth signal is based on a logic operation performed by the second logic circuit on the third signal and the fourth signal.

4. The method of claim 1, wherein:
the sixth signal comprises no pulse if the pulse width of the fifth signal is less than a width of a maximum rejectable pulse; and
the sixth signal comprises a pulse if the pulse width of the fifth signal is greater than a width of a minimum allowable pulse.

5. The method of claim 1, wherein the minimum pulse-width filter circuit comprises:
a low-pass filter communicatively coupled to an output of the second logic circuit; and
a Schmitt trigger circuit coupled to an output of the low-pass filter;
wherein an output of the Schmitt trigger circuit is the output of the minimum pulse-width filter circuit.

6. The method of claim 5, wherein the low-pass filter comprises:
a filter resistor that couples the output of the second logic circuit to an input of the Schmitt trigger circuit; and
a filter capacitor that couples the input of the Schmitt trigger circuit to a DC bias voltage node.

7. The method of claim 6, wherein:
the filter resistor and the filter capacitor smooth a pulse edge of a minimum allowable pulse provided to the low-pass filter; and
the Schmitt trigger circuit sharpens the pulse edge of the minimum allowable pulse.

8. The method of claim 6, wherein:
the filter resistor and the filter capacitor smooth a pulse edge of a maximum rejectable pulse provided to the low-pass filter; and
the Schmitt trigger circuit is not-responsive to the pulse edge of the maximum rejectable pulse.

9. The method of claim 1, wherein the first one-shot circuit and the second one-shot circuit each individually comprises:
a diode connected to the output of the minimum pulse-width filter circuit and a one-shot circuit node;
a resistor connected to the output of the minimum pulse-width filter circuit and the one-shot circuit node;
a capacitor that couples the one-shot circuit node to a DC bias voltage node; and
a third logic circuit communicatively coupled to the one-shot circuit node;
wherein an output of the third logic circuit of the first one-shot circuit is an output of the first one-shot circuit; and
wherein an output of the third logic circuit of the second one-shot circuit is an output of the second one-shot circuit.

10. The method of claim 9, wherein:
the first logic circuit is an AND gate;
the second logic circuit is an OR gate;
the third logic circuit of the first one-shot circuit is an OR gate; and
the third logic circuit of the second one-shot circuit is an AND gate.

11. The method of claim 1, wherein:
the first one-shot circuit extends a low pulse of the sixth signal to a first minimum width; and
the second one-shot circuit extends a high pulse of the sixth signal to a second minimum width.

12. The method of claim 1, wherein the minimum pulse-width assurance circuit communicatively couples a pulse-width modulator comparator to a gate driver in a power converter.

13. The method of claim 12, wherein the minimum pulse-width assurance circuit further comprises:
a buffer connected to the output of the minimum pulse-width filter circuit; and
a third input of the first logic circuit communicatively coupled to a pulse-width modulator blank signal source;
wherein the input of the minimum pulse-width assurance circuit is connected to the pulse-width modulator comparator; and
wherein an output of the buffer is communicatively coupled to the gate driver.

14. The method of claim 1, wherein:
the minimum pulse-width assurance circuit is absent of digital latches; and
the first one-shot circuit and the second one-shot circuit do not use a clock signal.

15. The method of claim 1, wherein:
the seventh signal comprises a first pulse generated by the first one-shot circuit in response to a high-to-low signal transition of a low pulse of the sixth signal;
the eighth signal comprises a second pulse generated by the second one-shot circuit in response to a low-to-high signal transition of a high pulse of the sixth signal;
the first one-shot circuit extends the low pulse of the sixth signal to a first minimum width; and
the second one-shot circuit extends the high pulse of the sixth signal to a second minimum width.

16. The method of claim 1, wherein:
the seventh signal comprises a first pulse generated by the first one-shot circuit in response to a low-to-high signal transition of a high pulse of the sixth signal;
the eighth signal comprises a second pulse generated by the second one-shot circuit in response to a high-to-low signal transition of a low pulse of the sixth signal;
the first one-shot circuit extends the high pulse of the sixth signal to a first minimum width; and
the second one-shot circuit extends the low pulse of the sixth signal to a second minimum width.

* * * * *